United States Patent
Sun et al.

(10) Patent No.: US 11,417,622 B2
(45) Date of Patent: Aug. 16, 2022

(54) FLIP-CHIP DEVICE

(71) Applicant: QUALCOMM Incorporated, San Diego, CA (US)

(72) Inventors: Yangyang Sun, San Diego, CA (US); John Holmes, San Diego, CA (US); Xuefeng Zhang, San Diego, CA (US); Dongming He, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/071,432

(22) Filed: Oct. 15, 2020

(65) Prior Publication Data
US 2021/0118834 A1   Apr. 22, 2021

Related U.S. Application Data

(60) Provisional application No. 62/923,237, filed on Oct. 18, 2019.

(51) Int. Cl.
*H01L 23/00* (2006.01)

(52) U.S. Cl.
CPC .............. *H01L 24/16* (2013.01); *H01L 24/06* (2013.01); *H01L 24/13* (2013.01); *H01L 2224/0401* (2013.01); *H01L 2224/13006* (2013.01); *H01L 2224/16227* (2013.01); *H01L 2924/15747* (2013.01)

(58) Field of Classification Search
CPC ...................................................... H01L 24/16
See application file for complete search history.

(56) References Cited

U.S. PATENT DOCUMENTS

| | | |
|---|---|---|
| 2003/0028853 A1 | 2/2003 | Deura |
| 2008/0142968 A1 | 6/2008 | Jadhav et al. |
| 2011/0115073 A1 | 5/2011 | Chen |
| 2013/0221521 A1* | 8/2013 | Yang ............... C22C 13/00 257/737 |
| 2013/0292817 A1 | 11/2013 | LaCroix et al. |
| 2017/0141064 A1 | 5/2017 | Murai et al. |

FOREIGN PATENT DOCUMENTS

EP   3389089 A1   10/2018

OTHER PUBLICATIONS

Partial International Search Report—PCT/US2020/055953—ISA/EPO—dated Feb. 3, 2021.
International Search Report and Written Opinion—PCT/US2020/055953—ISA/EPO—dated May 18, 2021.

* cited by examiner

*Primary Examiner* — William A Harriston
(74) *Attorney, Agent, or Firm* — Muncy, Geissler, Olds & Lowe P.C

(57) ABSTRACT

Disclosed are devices, fabrication methods and design rules for flip-chip devices. Aspects include an apparatus including a flip-chip device. The flip-chip device including a die having a plurality of under bump metallizations (UBMs). A package substrate having a plurality of bond pads is also included. A plurality of solder joints coupling the die to the package substrate. The plurality of solder joints are formed from a plurality of solder bumps plated on the plurality of UBMs, where the plurality of solder bumps are directly connected to the plurality of bond pads.

30 Claims, 8 Drawing Sheets

Solder Joint X-Section without SOP

FLIP-CHIP DEVICE

CROSS-REFERENCE TO RELATED APPLICATIONS

The present application for patent claims the benefit of Provisional Application No. 62/923,237 entitled "FLIP-CHIP DEVICE" filed Oct. 18, 2019, assigned to the assignee hereof and expressly incorporated herein by reference in its entirety.

FIELD OF DISCLOSURE

This disclosure relates generally to package devices, and more specifically, but not exclusively, to flip-chip devices and fabrication techniques for flip-chip devices.

BACKGROUND

Integrated circuit (IC) technology has achieved great strides in advancing computing power through miniaturization of active components. The flip-chip devices can be found in many electronic devices, including processors, servers, radio frequency (RF) integrated circuits, etc. Flip-chip packaging technology becomes cost-effective in high pin count devices. The flip-chip bonding conventionally uses solder-on-pad (SOP) technology for flip-chip substrates. There are many solutions for the SOP technology and each has its advantages and disadvantages.

For example, conventional substrate designs use SOP to fill in the opening of the solder resist on the top of the bond pad. Also, the SOP can help form the solder joint interconnection to the die. In conventional designs and fabrication processing, removing the SOP process could result in solder joint voids and failure issues. Accordingly, conventional baseline processes uses SOP for lead-free (LF) bump assembly. However, the SOP process adds additional costs and additional complexity to substrate fabrication processes.

Accordingly, there is a need for systems, apparatus, and methods that overcome the deficiencies of conventional SOP processes including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

At least one aspect includes a flip-chip device including a die having a plurality of under bump metallizations (UBMs). A package substrate having a plurality of bond pads is also included. A plurality of solder joints, coupling the die to the package substrate, are formed from a plurality of solder bumps plated on the plurality of UBMs being directly connected to metal bond pads.

At least one additional aspect includes a method for fabricating a flip-chip device. The method includes providing a die having a plurality of solder bumps plated on a plurality of under bump metallizations (UBMs); providing a package substrate having a plurality of bond pads; and forming a plurality of solder joints coupling the die to the package substrate and wherein the plurality of solder joints are formed from the plurality of solder bumps being directly connected to metal bond pads during a reflow process.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
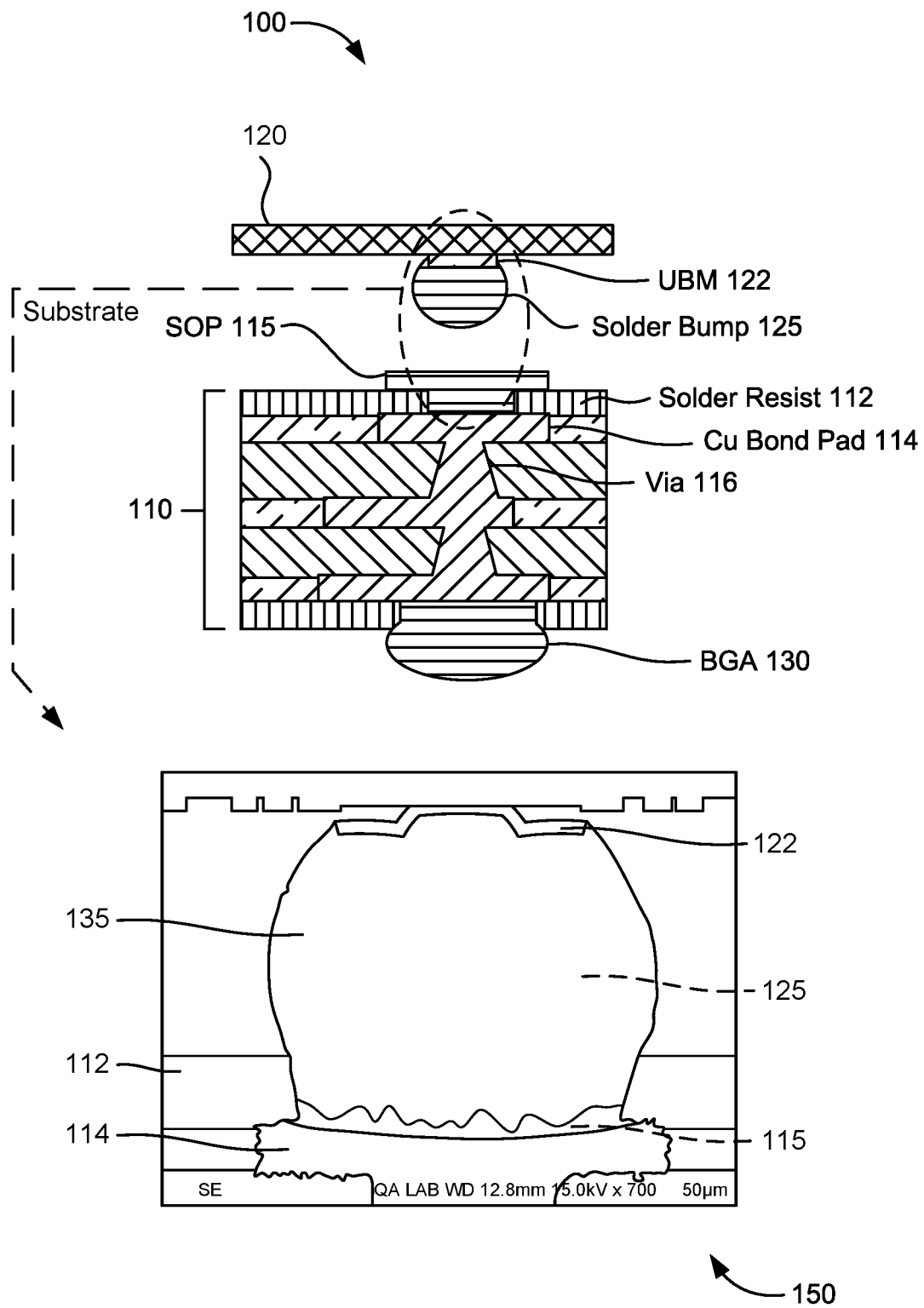
FIG. 1 illustrates a partial cross-sectional view of a conventional interconnection of a flip-chip device.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

FIG. 1 illustrates a partial side view of a conventional flip-chip device 100. As shown in FIG. 1, a flip-chip device 100 includes a package substrate 110 having a plurality of insulating and metal layers. The various metal layers can be interconnected using vias, such as via 116. On a backside of the package substrate a ball grid array (BGA) 130 can be used to connect to the package substrate and flip-chip package (formed of die 120 (also referred to herein as "chip" and package substrate 110) to external devices, circuitry, etc. On the front side of the package substrate 110 is a bond pad 114, illustrated as a copper bond pad 114. A solder resist layer 112 is formed over the bond pad 114. The solder resist layer 112 can be a photosensitive polymer material having a narrow opening to allow for connection to the bond pad 114. A solder-on-pad (SOP) 115 is provided to fill the opening to facilitate connection to the bond pad 114 in later operations. The SOP 115 can be formed by a solder drop or can be printed with a solder paste and reflow process to fill the opening. As discussed above, the SOP is used to prevent voids in the interconnection of the package substrate 110 to the die 120. The under bump metallization (UBM) 122 of the die 120 is used for connecting the die 120 to the package substrate 110 with solder bump 125 for flip-chip packages. The UBM 122 of the die 120 may be formed of aluminum or copper. A detailed image 150 illustrates a cross-section of the interconnection after the die 120 is attached to the package substrate 110. As illustrated, the solder joint 135 has a specific geometry (which will be discussed further below) and is formed from the solder bump 125 being fused with the SOP 115 to form an alloy. The solder joint 135 forms the electrical connection between the UBM 122 and bond pad 114 through the opening in the solder resist layer 112, which provides the electrical connection between die 120 and package substrate 110 for the flip-chip device 100. It will be appreciated that although only one interconnection between the die 120 and package substrate 110 is illustrated, a plurality of interconnections are used for the flip-chip device 100.

Figure 2A:
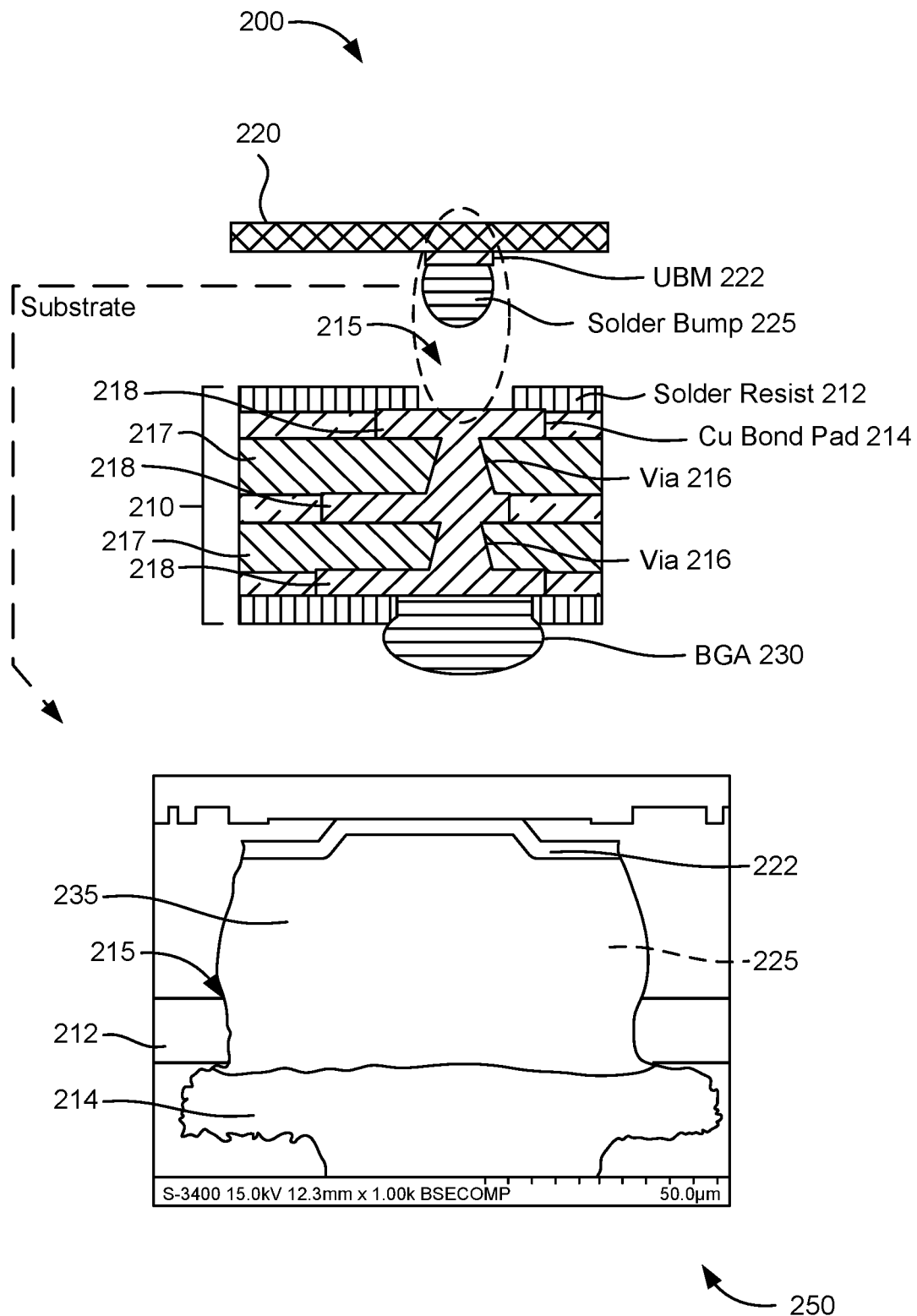
FIG. 2A illustrates a partial cross-sectional view of an interconnection of a flip-chip device in accordance with at least one aspect of the disclosure.

FIG. 2A illustrates a partial cross-sectional view of a flip-chip device 200 in accordance with one or more aspects of the disclosure. As shown in FIG. 2, a flip-chip device 200 includes a package substrate 210 having a plurality of insulating layers 217 and conductive layers 218. The insulating layers 217 may be interlayer dielectric (ILD) layers and may be formed of materials such as doped silicon dioxide (SiO2), or its fluorine-doped, carbon-doped, and carbon-doped forms, as well as spin-on organic polymeric dielectrics such as polyimide (PI), polynorbornenes, benzocyclobutene (BCB), polytetrafluoroethylene (PTFE) and/or silicone based polymeric dielectrics. The conductive layers 218 can be formed of any conductive material with high conductivity such as copper (Cu), silver (Ag), gold (Au), aluminum (Al) and other like materials, alloys or combination of materials. The various conductive layers can be interconnected using vias 216. On a backside of the package substrate a connection structure 230 (e.g., ball grid array (BGA)) can be used to connect to the package substrate 210/flip-chip device 200 (formed of die 220 (also referred to herein as "chip" and package substrate 210) to external devices, circuitry, etc. On the front side of the package substrate 210 is a bond pad 214, illustrated as a copper bond pad 214, however, it can be formed of any conductive material, such as the aforementioned materials. A solder resist layer 212 is formed over the bond pad 214. The solder resist layer 212 can be a photosensitive polymer material with a thickness of about 15 um having an enlarged solder resist opening (SRO) 215 to allow for connection to the bond pad 214. In the various aspects disclosed herein, it will be appreciated that in contrast to conventional designs and processes, SOP material is not provided to fill the SRO 215. As in the conventional art, the under bump metallization (UBM) 222 of the die 220 is used for connecting the die 220 to the package substrate 210 using solder bump 225 for the flip-chip package 200. The UBM 222 of the die 220 may be formed of aluminum or copper or any suitable conductive material.

A detailed image 250 illustrates a cross-section of the interconnection after the die 220 is attached to the package substrate 210. As illustrated in 250, a solder joint 235 is formed from the solder bump 225 being attached directly to the bond pad 214 (without SOP) to form an electrical connection between the UBM 222 and bond pad 214 through the SRO 215 in the solder resist layer 212. The solder joint 235 has a geometry that is distinct from the conventional solder joint (e.g., solder joint 135 discussed above), which will be described in greater detail below. The solder joint 235 forms the electrical connection between die 220 and package substrate 210 for the flip-chip device 200. It will be appreciated that although only one interconnection between the die 220 and package substrate 210 is illustrated, a plurality of interconnections are used for the flip-chip device 200.

According to various aspects disclosed herein, a new package substrate and die design rule was defined and tested to remove the SOP from the package substrate for the plated LF solder bump 225 attachment. The die level design rules, in some aspects, includes increased metal and via density under the solder bump 225. In conventional design rules, there is no clear or only limited specification for metal and via density under the UBM inside the back-end-of-line (BEOL) metal. Some foundries only have a general metal density rule for chemical mechanical polishing (CMP), such as 100 um by 100 um checking window, which does not focus on the UBM, with minimum metal of 10% or 20% and no special via density rule. The new die level design rules include that under the UBM area, a min. 20% metal density and 0.1% via density at 10 um by 10 um checking window, which provides for a high resolution checking window for extreme low-k (ELK) dielectric and upper metal and via layers under the UBM area. It will be appreciated that the resolution is significantly increased over the checking window of conventional designs. Further, according to one or more aspects, a new solder control rule was defined to reduce solder diameter and height of the solder bump 225. For example, in some aspects, a new bump specification for a LF bump on non-SOP pad includes for a UBM of 80 um, the bump height is reduced from 75 to 69 um and the solder diameter is reduced from 102 um to 90 um. According to one or more aspects, a new SRO rule was defined to form the SRO 215 to allow for good solder joint formation without voids. In some aspects, the SRO without SOP will be similarly sized to the solder diameter. For example, for 80 um UBM (solder diameter 90 um), SRO will also be 90 um. It will be appreciated that the various aspects disclosed allow for cost savings, such as removing the SOP process on the package substrate 210, in contrast to the SOP process performed in conventional processes.

Figure 2B:
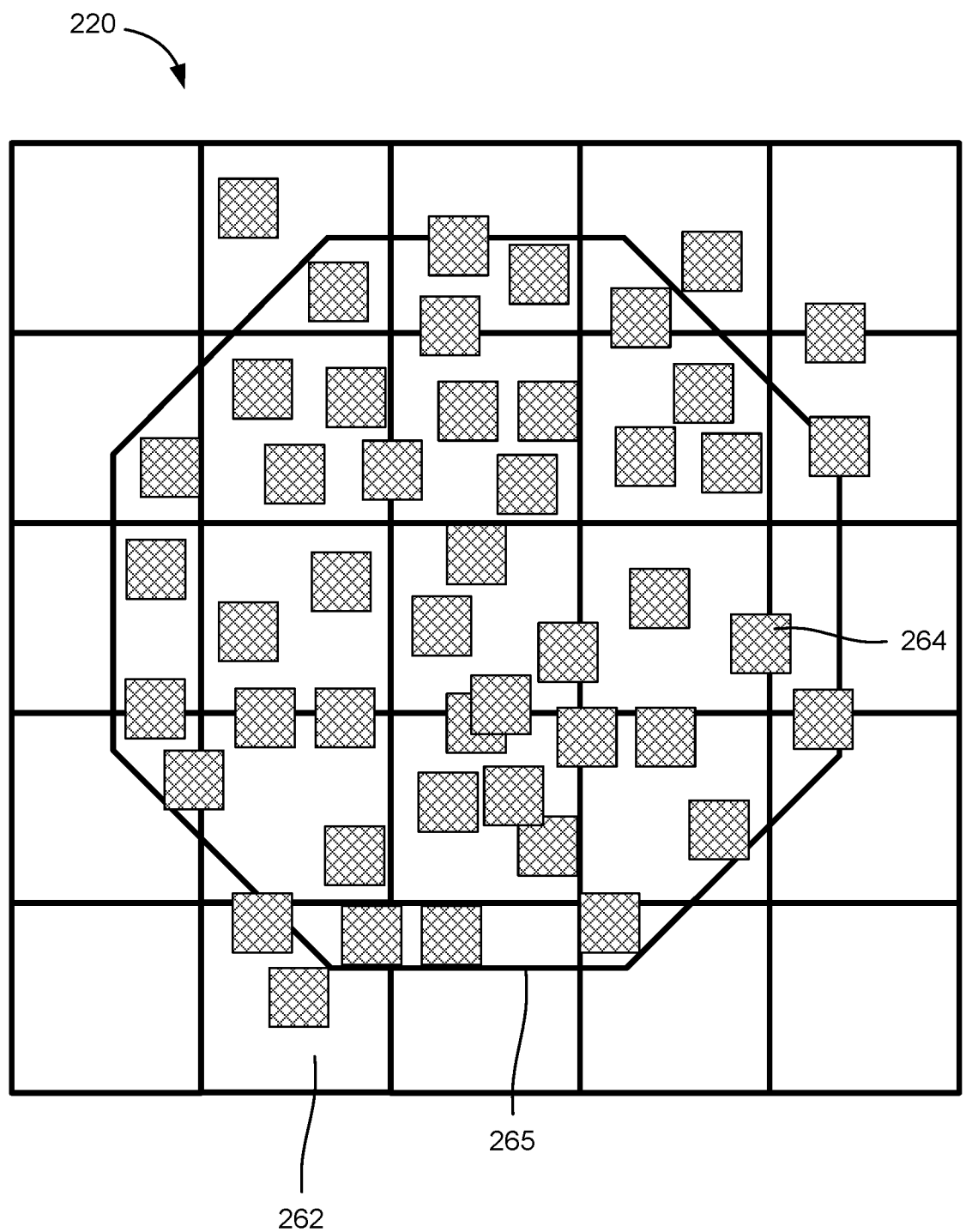
FIG. 2B illustrates a checking windows for a portion of a flip-chip device in accordance with at least one aspect of the disclosure.

FIG. 2B illustrates high resolution checking windows for a portion of the flip-chip device 200 in accordance with one or more aspects of the disclosure. As part of the new design rules, in die 220, a UBM area 265 contains a plurality of checking windows 262 at a higher resolution (i.e., smaller size) than conventional designs. Conventional larger windows can be used in areas on the die with no UBMs. In contrast, in conventional design rules, there is no clear or only limited specification for metal density under the UBM, as noted above. Conventional design rules use large windows that broadly check for metal without any concern for the metal in the die layers under the UBM. Accordingly, there may be low to zero metal and via density in the die layers under the UBM. In contrast, in the various aspects disclosed, the plurality of checking windows 262 cover the UBM area 265 and allow for determination of the metal and via density under the UBM area 265. The metal and vias under the UBM may be referred to and illustrated herein as metal filling 264. Checking windows 262 allow for further verification of a distribution of the metal fillings 264 under the UBM as determined by the UBM area 265. In the illustrated example, the checking windows 262 are in a 5 by 5 array covering the UBM area 265. In some aspects, the checking windows 262 may be on the range of 5 um by 5 um to 20 um by 20 um and in some aspects may be selected based on the UBM size. For example, a larger UBM may have a larger checking window, but still have multiple checking windows covering the UBM area to evaluate the metal and via density under the UBM. In a specific example, the checking window is 10 um by 10 um, as discussed above, to confirm a minimum metal density and via density under the UBM area 265. However, it will be appreciated that the checking windows 262 are not limited to the illustrated configurations or sizes, which are provided solely for discussion and illustration of the various aspects disclosed herein. Further, in some aspects, the checking windows 262 can be used to confirm that a majority of checking windows 262 within the UBM area 265 has at least some metal filling 264 to determine that metal fillings 264 are not concentrated in a particular portion of the UBM area 265. In further aspects, the checking windows 262 can be used to confirm that at least a given number of checking windows 262 within the UBM area 265 have a minimum density of metal fillings 264 (e.g., metal and via density). The various aspects disclosed herein establish and can determine (e.g., using the smaller checking windows 262) a minimum metal density and via density under the UBM area 265. Designers can use the determination from the checking windows 262 to redesign the metal layer routing and vias, if needed, to ensure the established minimums are met. In some aspects, increased mechanical stress may occur during the fabrication of the flip-chip device (e.g., during the coupling of the die to the package substrate). By ensuring a minimum metal density and via density under the UBM area 265, failures at the UBM can be reduced as the metal fillings 264 (e.g., metal and vias) under the UBM area 265 can provide increased support for the UBM compared to conventional designs. As discussed above, conventional designs do not check metal density or via density under the UBM area, which may allow for low density or no metal under the UBM area, which would provide less support to the UBM.

Figure 3:
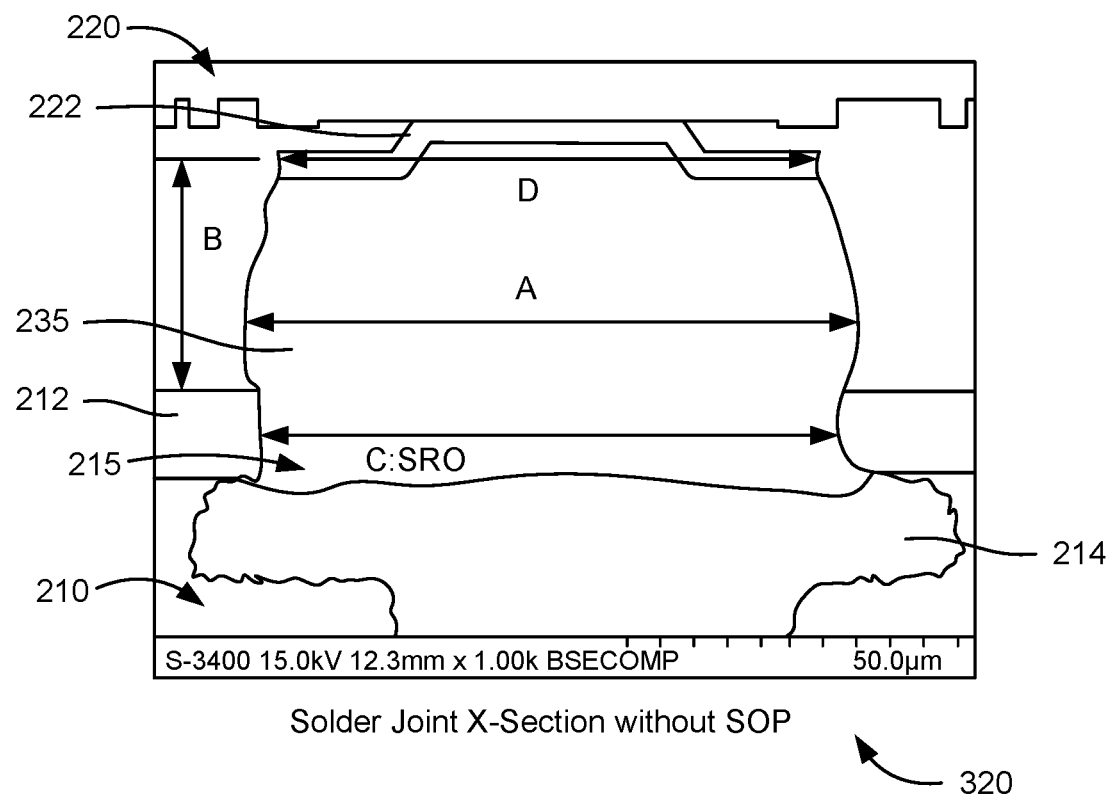
FIG. 3 illustrates an image of a partial cross-sectional view of interconnection of a flip-chip device in accordance with at least one aspect of the disclosure.

FIG. 3 illustrates a cross-section of an interconnection in accordance with one or more examples of the disclosure. A second detailed image 320 illustrates the cross-section of an interconnection between a die 220 and package substrate 210 without SOP according to various aspects of the disclosure. As illustrated in 320, the solder bump 225 has been attached directly to the bond pad 214 to form an electrical connection between the UBM 222 and bond pad 214 through the SRO 215 in the solder resist layer 212. This interconnection forms the electrical connection between die 220 and package substrate 210 for the flip-chip device 200. It will be appreciated that although only one interconnection between the die 220 and package substrate 210 is illustrated, a plurality of interconnections are used for the flip-chip device 200.

In addition to illustrating the various elements in image 320, various measurement references are provided. Some example measurements and example ranges are provided in Table 1 below. As can be seen from Table 1, the dimensions of the interconnections of flip-chip device 200 are generally smaller than the conventional design, with only the UBM 222 being generally the same size and the SRO 215 being slightly larger. Additionally, the solder bump 225 height of the various aspects of the disclosure has both a smaller diameter and height than the conventional design. After the die 220 attachment to the package substrate 210 (e.g., via reflow), the solder joint 235 diameter ("A" in 320) is still smaller than in the conventional designs. However, the bond line thickness ("B" in 320), which is on the range of half of the conventional designs. This results in a reduced bond line thickness to solder joint 235 diameter (B/A) ratio. For example, the B/A ratio is 0.37 for solder joint 235. Additionally, the bond line thickness impacts the overall height of the flip-chip device 200 as it represents the distance between the die 220 and the package substrate 210 at the solder joint 235. Accordingly, reducing the B/A ratio allows for a reduced overall height of the flip-chip device 200 and potentially increased RF performance since the connections between the die 220 and package substrate 210 will be shorter. Further, it will be appreciated that, unlike the conventional design with SOP, the solder bump 225 diameter is substantially equal to the SRO 215. This results in a solder joint 235 diameter that is only slightly larger than the SRO 215 (e.g., C/A ratio of 0.95) which results in the solder joint 235 having a generally cylindrical or column like shape, as can be seen in image 320. Table 1 provides some values for advance technology 28 nm or later. It will be appreciated that the specific example values provided above and in the table below are merely for illustration. In addition to some specific example values, Table 1 also provides example ranges for each reference.

TABLE 1

| Ref. | Geometry | Without SOP um (range) |
|---|---|---|
| A | Solder joint diameter (after chip attachment reflow) | 95 (90-105) |
| B | Bond line thickness (from chip surface to package substrate solder resist surface) | 35 (30-40) |
| C | SRO(solder resist opening) | 90 (80-110) |
| D | UBM(under bump metallurgy) | 80 (75-90) |
|  | Solder bump height before chip attachment | 69 (55-84) |
|  | Solder bump diameter before chip attachment | 90 (80-110) |
|  | B/A ratio | 0.37 (0.33-0.38) |
|  | C/A ratio | 0.95 (0.89-1.04) |

Figure 4:
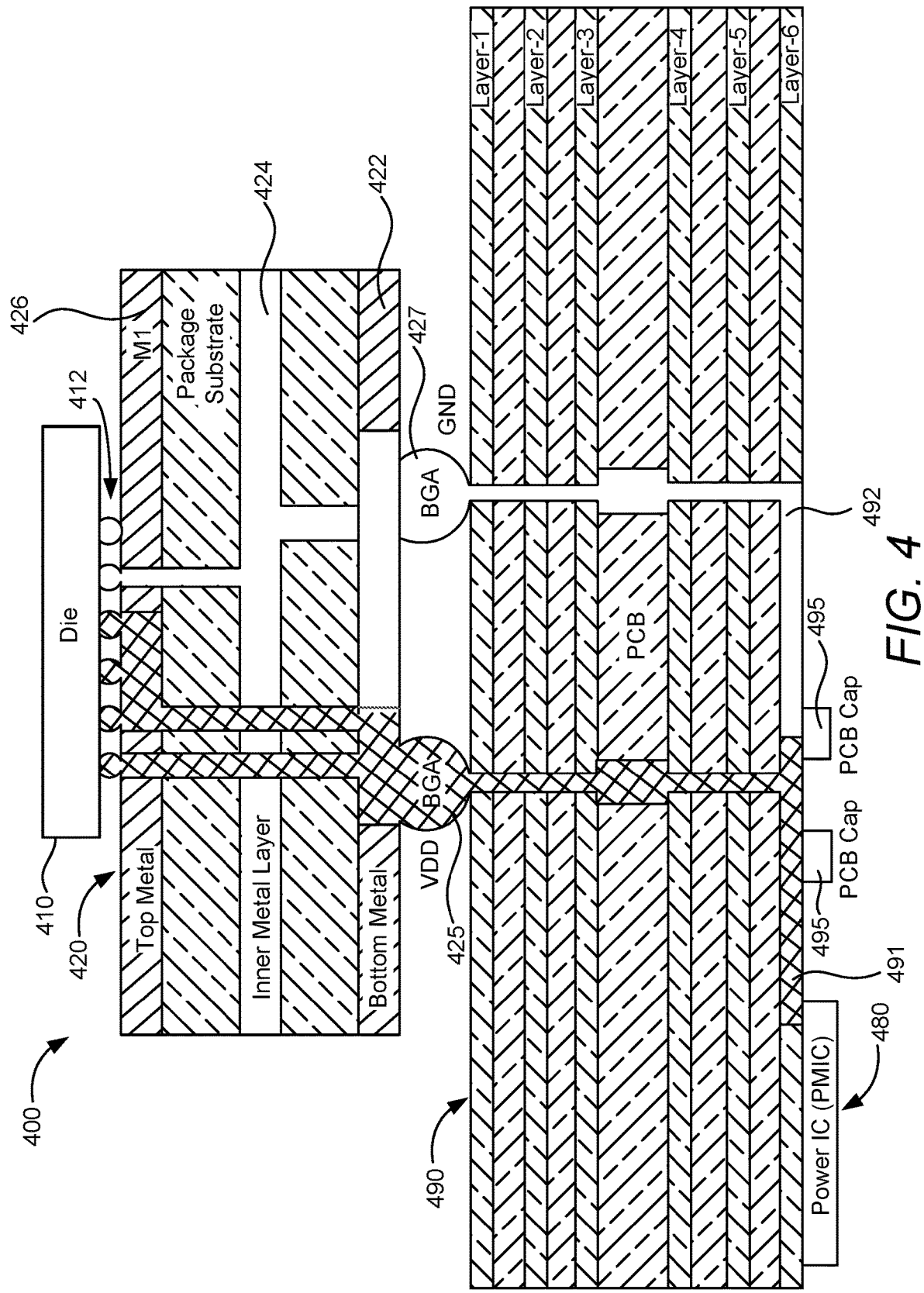
FIG. 4 illustrates an integrated device including a flip-chip device in accordance with at least one aspect of the disclosure.
Figure 5:
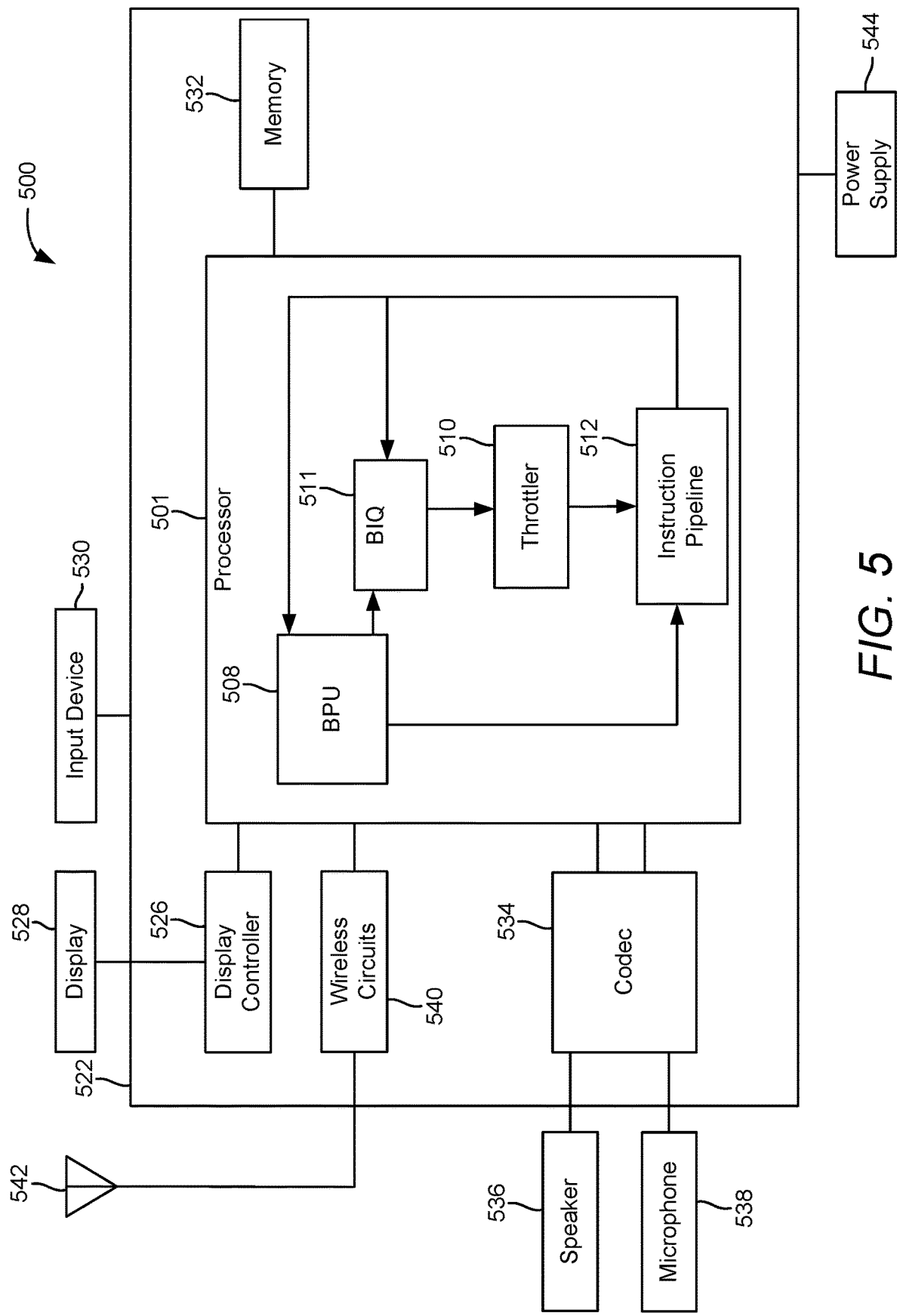
FIG. 5 illustrates a mobile device in accordance with at least one aspect of the disclosure.

FIG. 4 illustrates components of an integrated device 400 according to one or more aspects of the disclosure. Regardless of the various configurations of the flip-chip packages (e.g., die 410 and package substrate 420) discussed above, it will be appreciated that the package substrate 420 may be configured to couple the die 410 to a printed circuit board (PCB) 490. The PCB 490 may also be coupled to a power IC 480 (e.g., a power management integrated circuit (PMIC)), which regulates power to the integrated device 400 and allows the package substrate 420 and the die 410 to be electrically coupled to the power IC 480. Specifically, one or more power supply (VDD) lines 491 and one or more ground (GND) lines 492 may be coupled to the power IC 480 to distribute power to the PCB 490, package substrate 420 via VDD BGA pin 425 and GND BGA pin 427 and to the die 410 via die bumps 412 directly connected to the bond pads (not illustrated) of the package substrate 420, as discussed above. The VDD line 491 and GND line 492 each may be formed from traces, shapes or patterns in one or more metal layers of the PCB 490 (e.g., layers 1-6) coupled by one or more vias through insulating layers separating the metal layers 1-6 in the PCB 490. The PCB 490 may have one or more PCB capacitors (PCB cap) 495 that can be used to condition the power supply signals, as is known to those skilled in the art. Additional connections and devices may be coupled to and/or pass through the PCB 490 to the package via one or more additional BGA pins (not illustrated) on the package 420. Some or all of these signals may be coupled to the die 410 via die bumps 412 directly connected to the bond pads of the package substrate 420, as disclosed herein. It will be appreciated that the illustrated configuration and descriptions are provided merely to aid in the explanation of the various aspects disclosed herein. For example, the PCB 490 may have more or less metal and insulating layers, there may be multiple lines providing power, digital and/or analog signals to the various components, additional dies and/or package substrates may be coupled to the PCB 490, etc. Accordingly, the forgoing illustrative examples and associated figures should not be construed to limit the various aspects disclosed and claimed herein FIG. 5 illustrates a mobile device in accordance with some examples of the disclosure. Referring now to FIG. 5, a block diagram of a mobile device that is configured according to exemplary aspects is depicted and generally designated mobile device 500. In some aspects, mobile device 500 may be configured as a wireless communication device. As shown, mobile device 500 includes processor 501. Processor 501 is shown to comprise instruction pipeline 512, buffer processing unit (BPU) 508, branch instruction queue (BIQ) 511, and throttler 510 as is well known in the art. Other well-known details (e.g., counters, entries, confidence fields, weighted sum, comparator, etc.) of these blocks have been omitted from this view of processor 501 for the sake of clarity. Processor 501 may be communicatively coupled to memory 532 over a link, which may be a die-to-die or chip-to-chip link. Mobile device 500 also includes display 528 and display controller 526, with display controller 526 coupled to processor 501 and to display 528.

In some aspects, FIG. 5 may include coder/decoder (CODEC) 534 (e.g., an audio and/or voice CODEC) coupled to processor 501; speaker 536 and microphone 538 coupled to CODEC 534; and wireless circuits 540 (which may include a modem, RF circuitry, filters, etc., which may be implemented using one or more flip-chip devices, as disclosed herein) coupled to wireless antenna 542 and to processor 501.

In a particular aspect, where one or more of the above-mentioned blocks are present, processor 501, display controller 526, memory 532, CODEC 1234, and wireless circuits 540 can be included in a system-in-package or system-on-chip device 522 which may be implemented in whole or part using the flip-chip techniques disclosed herein. Input device 530 (e.g., physical or virtual keyboard), power supply 544 (e.g., battery), display 528, input device 530, speaker 536, microphone 538, wireless antenna 542, and power supply 544 may be external to system-on-chip device 522 and may be coupled to a component of system-on-chip device 522, such as an interface or a controller.

It should be noted that although FIG. 5 depicts a mobile device, processor 501, memory 532 and other components may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
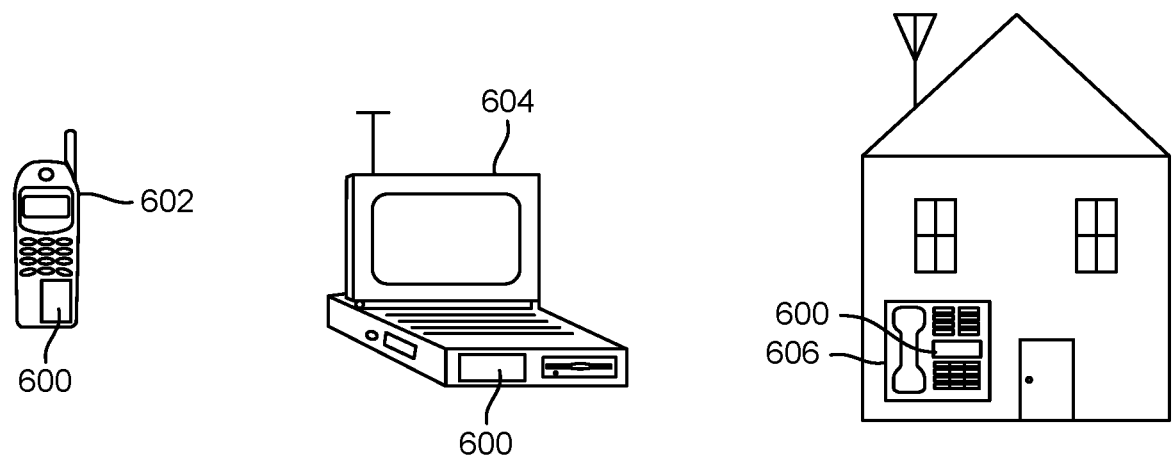
FIG. 6 illustrates various electronic devices that may be integrated with any of the aforementioned flip-chip devices in accordance with at least one aspect of the disclosure.

FIG. 6 illustrates various electronic devices that may be integrated with any of the aforementioned integrated device or semiconductor device in accordance with various examples of the disclosure. For example, a mobile phone device 602, a laptop computer device 604, and a fixed location terminal device 606 may each be consider generally user equipment (UE) and may include a flip-chip device 600 as described herein. The flip-chip device 600 may be, for example, any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the flip-chip device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

In accordance with the various aspects disclosed herein, at least one aspect includes a flip-chip device (e.g., 200) including a die (e.g., 220) having a plurality of under bump metallizations (UBMs) (e.g., 222). The flip-chip device further includes a package substrate (e.g., 210) having a plurality of bond pads (e.g., 214). A plurality of solder joints (e.g., 235) to couple the die to the package substrate. The plurality of solder joints are formed from a plurality of solder bumps (e.g., 225) plated on the plurality of UBMs and being directly connected to the plurality of bond pads. Among the various technical advantages provided by the disclosed aspects, in at least some aspects, having solder joints (e.g., 235) formed by directly coupling the solder bumps (e.g., 225) plated on the plurality of UBMs (e.g., 222) to the plurality of bond pads (e.g., 214) eliminates the need for SOP processing of the package substrate (e.g., 210), as discussed above. Additionally, the spacing between the die (e.g., 220) and the package substrate (e.g., 210) and overall height of the flip-chip device (e.g., 200) is reduced. Further, the solder bump plating time can be reduced since the solder diameter and height is reduced relative to conventional designs.

In order to fully illustrate the various aspects of the present disclosure, methods of fabrication are presented. It will be appreciated that the illustrated configurations, materials and descriptions are provided merely to aid in the explanation of the various aspects disclosed herein. Additionally, details related to the fabrication are not provided, as they are not necessary for an understanding of the aspects disclosed and would be easily recognized by one skilled in the art. Further, various methods of fabrication are possible, and discussed fabrication methods are presented only to aid in the understanding of the concepts disclosed herein.

Figure 7:
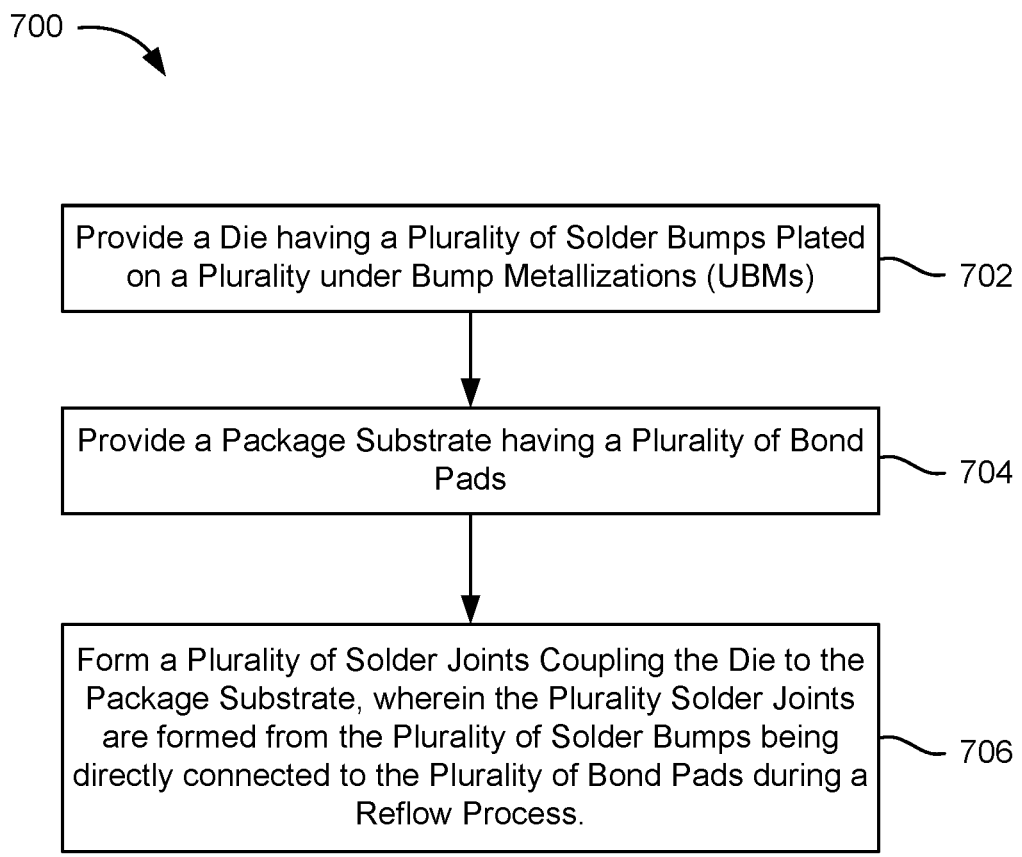
FIG. 7 illustrates a flowchart of a method for manufacturing a flip-chip device in accordance with at least one aspect of the disclosure.

It will be appreciated from the foregoing that there are various methods for fabricating semiconductors including a flip-chip disclosed herein. FIG. 7 illustrates a flowchart of a method for manufacturing a flip-chip device in accordance with some examples of the disclosure. As shown in FIG. 7, the partial method 700 may begin in block 702 with providing a die having a plurality of solder bumps plated on a plurality of under bump metallizations (UBMs). The partial method 700 may continue in block 704 with providing a package substrate having a plurality of bond pads. The partial method 700 continue in block 706 with forming a plurality of solder joints coupling the die to the package substrate, wherein the plurality of solder joints are formed from the plurality of solder bumps being directly connected to metal bond pads during a reflow process. As discussed above, by directly connecting the solder bumps to the bond pads without SOP, package substrate processing costs can be saved and the solder joint is smaller resulting in a potential reduction of overall height of the flip-chip package. The package substrate and/or die can be formed using the new design rules discussed herein. Accordingly, it will be appreciated from the foregoing disclosure that additional processes for fabricating the various aspects disclosed herein will be apparent to those skilled in the art and a literal rendition of the processes discussed above will not be provided or illustrated in the included drawings.

The foregoing disclosed devices, design rules and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into a flip-chip package. The flip-chip packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and corresponding description in the present disclosure are not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on Institute of Electrical and Electronics Engineers (IEEE) 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network.

The word "exemplary" is used herein to mean "serving as an example, instance, or illustration." Any detail described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in each claim. Rather, the various aspects of the disclosure may include fewer than all features of an individual example disclosed. Therefore, the following claims should hereby be deemed to be incorporated in the description, wherein each claim by itself can stand as a separate example. Although each dependent claim can refer in the claims to a specific combination with one of the other claims, the aspect(s) of that dependent claim are not limited to the specific combination. It will be appreciated that other aspects disclosed can also include a combination of the dependent claim aspect(s) with the subject matter of any other dependent claim or independent claim or a combination of any feature with other dependent and independent claims. The various aspects disclosed herein expressly include these combinations, unless it is explicitly expressed or can be readily inferred that a specific combination is not intended (such as contradictory aspects, where the combination would define an element as two alternative components, materials, etc.). Furthermore, it is also intended that aspects of a claim can be included in any other independent claim(s), even if the claim is not directly dependent on the independent claim(s). For example, further aspects may include one or more of the following features discussed in the various example aspects.

Example aspect 1 includes an apparatus including a flip-chip device, the flip-chip device comprising: a die having a plurality of under bump metallizations (UBMs); a package substrate having a plurality of bond pads; and a plurality of solder joints coupling the die to the package substrate, wherein the plurality of solder joints are formed from a plurality of solder bumps plated on the plurality of UBMs, the plurality of solder bumps being directly connected to the plurality of bond pads.

Example aspect 2, which may be combined with the foregoing example aspect 1, includes wherein the flip-chip device has a bond line thickness to solder joint diameter ratio of approximately 0.64, where the bond line thickness is a distance between the die and the package substrate.

Example aspect 3, which may be combined with the foregoing example aspects 1 and 2, includes wherein the bond line thickness is approximately 35 um.

Example aspect 4, which may be combined with the foregoing example aspects 1 to 3, includes wherein a solder joint diameter for each of the plurality of solder joints is approximately 95 um.

Example aspect 5, which may be combined with the foregoing example aspects 1 to 3, further includes a solder resist layer, of the package substrate, having a solder resist opening (SRO) over each bond pad of the plurality of bond pads, wherein a ratio of SRO to solder joint diameter is approximately 0.95.

Example aspect 6, which may be combined with the foregoing example aspect 5, includes wherein the SRO over each bond pad is approximately 35 um.

Example aspect 7, which may be combined with the foregoing example aspects 5 and 6, includes wherein the solder joint diameter for each of the plurality of solder joints is approximately 95 um.

Example aspect 8, which may be combined with the foregoing example aspects 1 to 3, includes wherein the flip-chip device has a bond line thickness to solder joint diameter ratio in a range of approximately 0.3 to 0.7, where the bond line thickness is a distance between the die and the package substrate.

Example aspect 9, which may be combined with the foregoing example aspect 8, includes wherein the bond line thickness is in a range of approximately 30 um to 60 um.

Example aspect 10, which may be combined with the foregoing example aspect 9, includes wherein a solder joint diameter for each of the plurality of solder joints is in a range of approximately 70 um to 180 um.

Example aspect 11, which may be combined with the foregoing example aspects 1 to 10, includes wherein the plurality of solder joints, each has a generally cylindrical or columnar shape.

Example aspect 12, which may be combined with the foregoing example aspects 1 to 11, includes wherein the plurality of bond pads are formed of copper.

Example aspect 13, which may be combined with the foregoing example aspects 1 to 12, includes wherein each UBM, of the plurality of UBMs, has a minimum metal density and a minimum via density in an area under each UBM.

Example aspect 14, which may be combined with the foregoing example aspect 13, includes wherein the minimum metal density is 20 percent.

Example aspect 15, which may be combined with the foregoing example aspects 13 and 14, includes wherein the minimum via density is 0.1 percent.

Example aspect 16, which may be combined with the foregoing example aspects 13 to 15, includes wherein the area under the UBM is divided into a plurality of checking windows to check the minimum metal density and the minimum via density.

Example aspect 17, which may be combined with the foregoing example aspect 16, includes wherein each checking window is in the range of 5 um by 5 um to 20 um by 20 um.

Example aspect 18, which may be combined with the foregoing example aspects 1 to 17, includes wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Example aspect 19 includes a method for manufacturing a flip-chip device, the method comprising: providing a die having a plurality of solder bumps plated on a plurality of under bump metallizations (UBMs); providing a package substrate having a plurality of bond pads; and forming a plurality of solder joints coupling the die to the package substrate, wherein the plurality of solder joints are formed from the plurality of solder bumps being directly connected to the plurality of bond pads during a reflow process.

Example aspect 20, which may be combined with the foregoing example aspect 19, includes wherein the flip-chip device has a bond line thickness to solder joint diameter ratio of approximately 0.64, where the bond line thickness is a distance between the die and the package substrate.

Example aspect 21, which may be combined with the foregoing example aspect 20, includes wherein the bond line thickness is approximately 35 um.

Example aspect 22, which may be combined with the foregoing example aspects 19 to 21, includes wherein a solder joint diameter for each of the plurality of solder joints is approximately 95 um.

Example aspect 23, which may be combined with the foregoing example aspect 22, includes wherein the package substrate includes a solder resist layer having a solder resist opening (SRO) over each bond pad of the plurality of bond pads and wherein a ratio of SRO to solder joint diameter is approximately 0.95.

Example aspect 24, which may be combined with the foregoing example aspects 22 to 23, includes wherein the SRO over each bond pad is approximately 35 um.

Example aspect 25, which may be combined with the foregoing example aspects 22 to 24, includes wherein the solder joint diameter for each of the plurality of solder joints is approximately 95 um.

Example aspect 26, which may be combined with the foregoing example aspects 19 to 23, further includes checking a minimum metal density and a minimum via density in an area under each UBM of the plurality of UBMs.

Example aspect 27, which may be combined with the foregoing example aspect 26, includes wherein the minimum metal density is 20 percent.

Example aspect 28, which may be combined with the foregoing example aspects 26 and 27, includes the minimum via density is 0.1 percent.

Example aspect 29, which may be combined with the foregoing example aspects 26 to 28, includes the area under the UBM is divided into a plurality of checking windows to check the minimum metal density and the minimum via density.

Example aspect 30, which may be combined with the foregoing example aspect 29, includes each checking window is in the range of 5 um by 5 um to 20 um by 20 um.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus including a flip-chip device, the flip-chip device comprising:
   a die having a plurality of under bump metallizations (UBMs);
   a package substrate having a plurality of bond pads; and
   a plurality of solder joints coupling the die to the package substrate, wherein the plurality of solder joints are formed from a plurality of solder bumps plated on the plurality of UBMs, the plurality of solder bumps being directly connected to the plurality of bond pads,
   wherein the flip-chip device has a bond line thickness to solder joint diameter ratio of less than one, the bond line thickness being a distance between the die and the package substrate.

2. The flip-chip device of claim 1, wherein the flip-chip device has the bond line thickness to solder joint diameter ratio of approximately 0.64.

3. The flip-chip device of claim 2, wherein the bond line thickness is approximately 35 um.

4. The flip-chip device of claim 2, wherein a solder joint diameter for each of the plurality of solder joints is approximately 95 um.

5. The flip-chip device of claim 1, further comprising:
   a solder resist layer, of the package substrate, having a solder resist opening (SRO) over each bond pad of the plurality of bond pads, wherein a ratio of SRO to solder joint diameter is approximately 0.95.

6. The flip-chip device of claim 5, wherein the SRO over each bond pad is approximately 35 um.

7. The flip-chip device of claim 5, wherein the solder joint diameter for each of the plurality of solder joints is approximately 95 um.

8. The flip-chip device of claim 1, wherein the flip-chip device has the bond line thickness to solder joint diameter ratio in a range of approximately 0.3 to 0.7.

9. The flip-chip device of claim 8, wherein the bond line thickness is in a range of approximately 30 um to 60 um.

10. The flip-chip device of claim 8, wherein a solder joint diameter for each of the plurality of solder joints is in a range of approximately 70 um to 180 um.

11. The flip-chip device of claim 1, wherein the plurality of solder joints, each has a generally cylindrical or columnar shape.

12. The flip-chip device of claim 1, wherein the plurality of bond pads are formed of copper.

13. The flip-chip device of claim 1, wherein each UBM, of the plurality of UBMs, has a minimum metal density and a minimum via density in an area under each UBM.

14. The flip-chip device of claim 13, wherein the minimum metal density is 20 percent.

15. The flip-chip device of claim 13, wherein the minimum via density is 0.1 percent.

16. The flip-chip device of claim 13, wherein the area under the UBM is divided into a plurality of checking windows to check the minimum metal density and the minimum via density.

17. The flip-chip device of claim 16, wherein each checking window is in a range of 5 um by 5 um to 20 um by 20 um.

18. The apparatus of claim 1, wherein the apparatus is selected from a group comprising at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

19. A method for manufacturing a flip-chip device, the method comprising:
providing a die having a plurality of solder bumps plated on a plurality of under bump metallizations (UBMs);
providing a package substrate having a plurality of bond pads; and
forming a plurality of solder joints coupling the die to the package substrate, wherein the plurality of solder joints are formed from the plurality of solder bumps being directly connected to the plurality of bond pads during a reflow process,
wherein the flip-chip device has a bond line thickness to solder joint diameter ratio of less than one, the bond line thickness being a distance between the die and the package substrate.

20. The method of claim 19, wherein the flip-chip device has the bond line thickness to solder joint diameter ratio of approximately 0.64.

21. The method of claim 20, wherein the bond line thickness is approximately 35 um.

22. The method of claim 20, wherein a solder joint diameter for each of the plurality of solder joints is approximately 95 um.

23. The method of claim 19, wherein the package substrate includes a solder resist layer having a solder resist opening (SRO) over each bond pad of the plurality of bond pads and wherein a ratio of SRO to solder joint diameter is approximately 0.95.

24. The method of claim 23, wherein the SRO over each bond pad is approximately 35 um.

25. The method of claim 23, wherein the solder joint diameter for each of the plurality of solder joints is approximately 95 um.

26. The method of claim 19, further comprising:
checking a minimum metal density and a minimum via density in an area under each UBM of the plurality of UBMs.

27. The method of claim 26, wherein the minimum metal density is 20 percent.

28. The method of claim 26, wherein the minimum via density is 0.1 percent.

29. The method of claim 26, wherein the area under the UBM is divided into a plurality of checking windows to check the minimum metal density and the minimum via density.

30. The method of claim 29, wherein each checking window is in a range of 5 um by 5 um to 20 um by 20 um.

* * * * *